United States Patent [19]

Cooke et al.

[11] 3,851,271

[45] Nov. 26, 1974

[54] BROAD BAND INJECTION-TUNED GUNN DIODE MICROWAVE OSCILLATOR

[75] Inventors: Roger Ernest Cooke, Bishop Stortford; Rodney Frederick Barker Conlon, Sawbridgeworth, both of England

[73] Assignee: International Standard Electric Corporation, New York, N.Y.

[22] Filed: Aug. 23, 1973

[21] Appl. No.: 391,169

[30] Foreign Application Priority Data

Nov. 28, 1972 Great Britain .................... 54881/72

[52] U.S. Cl................. 331/47, 331/107 G, 331/172

[51] Int. Cl. ............................................ H03b 7/14

[58] Field of Search....... 331/47, 107 G, 172, 177 R

[56] References Cited

UNITED STATES PATENTS 3,737,804 6/1973 Sakamoto et al.......... 331/107 G X

OTHER PUBLICATIONS

Ivanek et al., "Electronics Letters," Vol. 5, May 15, 1969, pp. 214–216.

Shaw et al., "Proceedings of the IEEE," April, 1966, pp. 710–711.

*Primary Examiner*—Herman Karl Saalbach
*Assistant Examiner*—Siegfried H. Grimm
*Attorney, Agent, or Firm*—John T. O'Halloran; Menotti J. Lombardi, Jr.; Alfred C. Hill

[57] ABSTRACT

This relates to a broadband injection-tuned Gunn diode microwave oscillator module. The module includes a Gunn diode and a microwave resonant cavity. The resonant cavity is a multi-tuned circuit to present the Gunn diode with its negative impedance over the requisite frequency band. The cavity is an evanescent mode waveguide. Tuning is accomplished solely by an injection locking signal which modifies the impedance of the cavity to match the Gunn diode over the requisite frequency band. This type of tuning eliminates the need for either electronic tuning of the Gunn diode and/or mechanical tuning of the cavity.

4 Claims, 11 Drawing Figures

BROAD BAND INJECTION-TUNED GUNN DIODE MICROWAVE OSCILLATOR

BACKGROUND OF THE INVENTION

This invention relates to a microwave oscillator arrangement.

Broadband microwave oscillator arrangements employing two terminal solid state oscillator devices, such as Gunn devices, are conventionally tuned by adjustment of the resonant circuit, either electronically, for example, by varactor tuning or variation of the bias of the oscillator device, or in the case of resonant cavity by mechanical adjustment of the cavity. Together with such tuning there may be frequency control by means of a low level injected signal of the required frequency, i.e., injection locking, but the conventional approach requires suitable adjustment of the resonant circuit for different oscillator frequencies.

SUMMARY OF THE INVENTION

An object of this invention is to achieve wideband frequency control solely by means of the injected signal, without the need for either electronic or mechanical adjustment of the resonant circuit.

A feature of the present invention is the provision of a microwave oscillator arrangement with wideband frequency control comprising: a multi-tuned microwave resonant circuit; a two terminal solid state microwave oscillator device disposed in the resonant circuit; and a frequency controlling injection locking oscillator coupled to the resonant circuit, the locking oscillator having an injection locking output signal which modifies the impedance of the resonant circuit so that over a required frequency band the oscillator device is presented with the negative of its impedance.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

Figure 1:
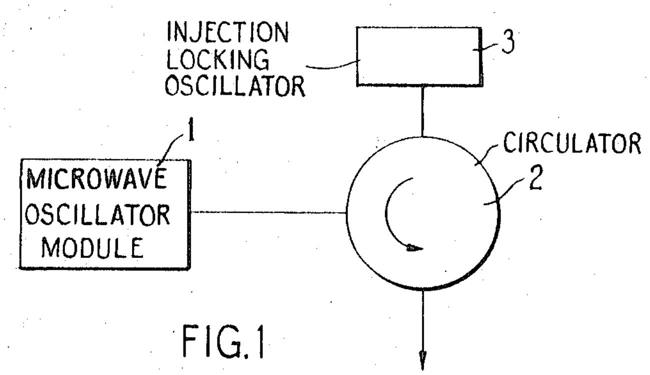
FIG. 1 is a block diagram of a microwave oscillator module coupled by a circulator to a frequency controlling injection locking signal source in accordance with the principles of the present invention.

The oscillator arrangement shown in FIG. 1 is for operation in the frequency range 3 – 4 GHz (gigahertz) and comprises a microwave oscillator module 1 coupled to one port of a circulator 2 and an injection locking oscillator 3 coupled to another port of the circulator 2, the third (output) circulator port being for coupling, for example, to a radar antenna for pulsed excitation thereof.

Module 1 divides basically into two parts — a Gunn device or diode and an output tuning section of a resonant circuit constituted by a microwave resonant cavity. Details of the module will be given later in the description in conjunction with FIGS. 5 and 6. However, it is now intended to present the general principles on which the oscillator arrangement functions.

A suitable starting point for this is to consider, in a typical conventional arrangement, the function of a varactor diode in the resonant circuit over the frequency range of interest. This function is to introduce an electronically variable capacitance which combines with the circuit impedance in such a way that the required frequency dependent load is established. If this load can be obtained by purely passive means through broadband circuit design, the varactor becomes unnecessary, and, hence, control solely by means of an injected signal is possible.

Over the required frequency band of the oscillator, therefore, it is basically required that the resonant circuit should present the Gunn device with an impedance which is equal to but opposite in sign to that of the Gunn device.

The phenomenon of injection locking is well established, and as far as the Gunn device is concerned can be described by an equivalent parallel admittance of generally complex character which modifies the circuit loading. The effect is more fully described later, but briefly defines an admittance which adds capacitance below the free-running (resonant) frequency of the circuit, and, conversely, inductance above it. It is, therefore, unnecessary to have an exact match between the circuit and Gunn device admittances providing any difference is in the sense indicated and can be bridged by the locking signal. Nevertheless, the better the initial match the wider the achievable bandwidth, and alternatively, for a given bandwidth the smaller the locking signal.

Figure 2:
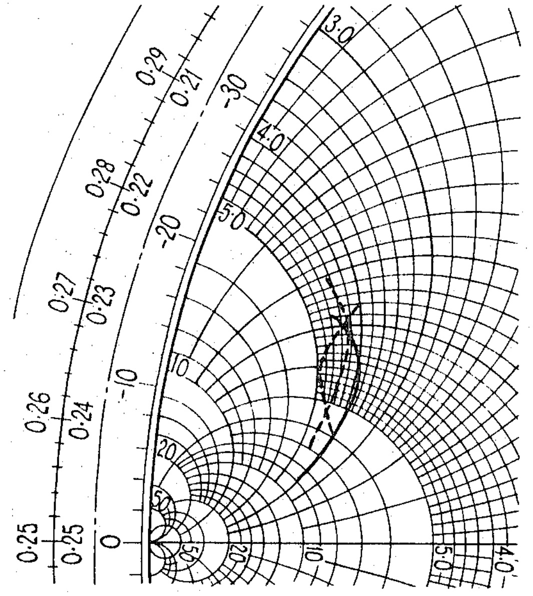
FIG. 2 is a Smith chart showing a Gunn device or diode admittance loci from 3.2 to 3.6 GHz.

In order that a correct reference for the resonant circuit may be established, it is necessary to determine the impedance (admittance) characteristics of the Gunn device as an oscillator. Typical impedance plots of three different Gunn devices are shown in FIG. 2. The main point to emerge from FIG. 2 is that to match a Gunn oscillator device the resonant circuit must present a counterclockwise locus with increasing frequency, the magnitude of which depends on both the size and resistivity of the Gunn device. Apart from these size and resistivity effects, the loci are basically similar with, in each case, a characteristic increase in conductance with increasing frequency.

Figure 3:
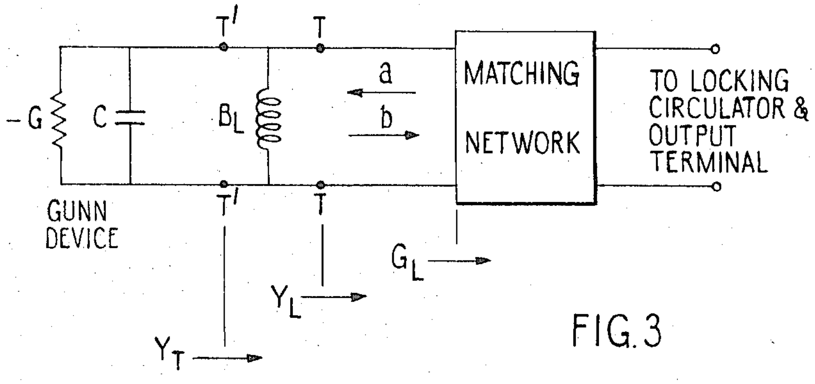
FIG. 3 is an equivalent circuit diagram of the module of FIG. 1 illustrating the locking signal analysis.

Turning now to the locking signal, as far as the Gunn device is concerned this can be regarded as a straightforward reflection from the load of reflection coefficient.

$$R = a/b = re^{j\theta} \qquad (1)$$

where $a$ and $b$ are the locking and output signal voltages, respectively, with $r$ the magnitude of the reflection coefficient and $\theta$ its stationary phase under locked conditions. Referring to FIG. 3 the load admittance in plane TT, therefore, appears as $$Y_L = G_L\,(1-R/1+R) \tag{2}$$

which enables the total admittance across the device (in plane T'T') to be written as $$Y_T = G_L - 2G_L\,[r^2 + r\cos\theta/1 + 2r\cos\theta + r^2] + j\{-B_L + G_L\,2r\sin\theta/1 + 2r\cos\theta\, r + r^2\,]\} \tag{3}$$

Here $$(G_L + jB_L) \tag{4}$$

represents the basic cavity loading of the Gunn device, while $$-2G_L\,[\,r^2 + r\cos\theta/1 + 2r\cos\theta + r^2\,] + jG_L\,[\,2r\sin\theta/1 + 2r\cos\theta + r^2\,] \tag{5}$$

defines an equivalent admittance for the locking signal. The total load across the Gunn device can, therefore, be considered as the vector sum of two admittances, the resultant susceptance of which determines the frequency of oscillation and the resultant conductance of which determines the power output.

Returning to the reflection coefficient, the relationship between $r$ and the locking gain of the system is immediately apparent ($r = 1/\sqrt{GAIN}$), and needs no formal explanation. The phase angle $\theta$, however, is more difficult to understand, and is best evaluated in order to indicate its true significance. This is accomplished by equating the total susceptance of the system to zero, which for the practical case of a high locking gain (i.e., $r >> 1$) leads to the equation:

$$\omega C - 1/\omega L + G_L\,2r\sin\theta = 0 \tag{6}$$

and, subsequently, the result:

$$\sin\theta = -Q\,[\omega - \omega_o/\omega_o]\,1/r \tag{7}$$

Here $\omega_o$ is the free-running (resonant) frequency of the cavity, with $Q$-value equal to $\omega_o C/G_L$. $\theta$, therefore, is a measure of the normalized frequency difference between the locked and free-running outputs of the cavity, and depends also on the $Q$ of the cavity and the locking gain employed.

It is instructive to note at this point that the limits of the locking band are determined by the condition $\sin\theta = \pm 1$, setting $\theta_{max/min} = \pm 90°$. This means that the total locking band, defined as $(\omega_{max} - \omega_{min})$, $$= r/Q = 1/Q\,\sqrt{P_{LOCK}/P_{OUT}} \tag{8}$$

which is recognized as the standard locking expression.

Figure 4:
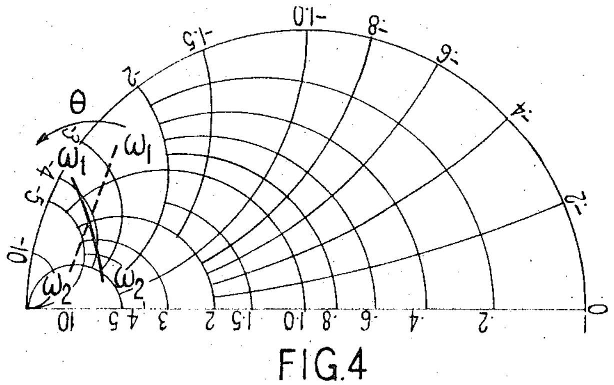
FIG. 4 is a Smith chart showing the basic relationship between the Gunn device and circuit admittance loci.

From the preceding description it is clear that precise matching of the circuit and device admittance is not a prerequisite of broadband operation, although the best results must necessarily be achieved when this is the case. There are, however, certain restrictions on the amplitude and phase of the mismatch which should be appreciated at this state, and a qualitative understanding of these can be obtained by reference to the admittance of the locking signal (equations (5) and (7) above). This is shown to be generally complex in character, with the susceptance changing from capacitive to inductive as the frequency increases through the free-running value, at which point the conductance is numerically a maximum decaying to a low level (note $r = 1$) at the edges of the band. It is therefore necessary, failing an exact match, that the circuit and device admittance loci intersect at a common frequency to establish free running operation, with any mismatch towards the band edges occurring as a counter clockwise displacement of the circuit locus relative to the Gunn device $\omega_1$ as in FIG. 4. The angle of displacement is evidently a function of the locking gain involved, and as such approaches a maximum as this approaches unity.

It should be noted at this point that the above analysis applies to the particular case of a Gunn device having a constant resistance and capacitance for its equivalent circuit. This is an approximation but does, nevertheless, enable the basic features of injection locking to be established.

From the above, it is clear that the circuit design problem becomes less demanding the higher the locking power, since this generates a larger locking susceptance with correspondingly less stringent design tolerances. Some compromise, however, must be reached with the locking conductance, which becomes increasingly significant as the gain is reduced, thus, having a larger effect on the device output. In any practical case it may be assumed that the circuit will be adjusted for optimum performance under free running (resonant) conditions, in which case there will be a departure from optimum when locking occurs, hence, a reduction in power output. The size of the effect must necessarily depend on the sensitivity of the Gunn device to conductance changes, and is best determined experimentally for the particular device and drive conditions involved. Based on the simple analysis above, this power variation should decrease towards the edges of the band as the conductance modification is reduced. The exact nature of the effect, however, will depend on the circuit employed and, in particular, on the impedance transformation involved. Some departure from the simple picture, where the loss is symmetrical, may, therefore, result.

It is, thus, apparent that the locking signal, although capable of controlling the frequency of oscillation, can only achieve this at the expense of a modified circuit conductance which in general will manifest itself as an equivalent loss. Both effects depend on the locking gain employed and, in this respect, a compromise between achievable bandwidth and loss must be sought.

Figure 5:
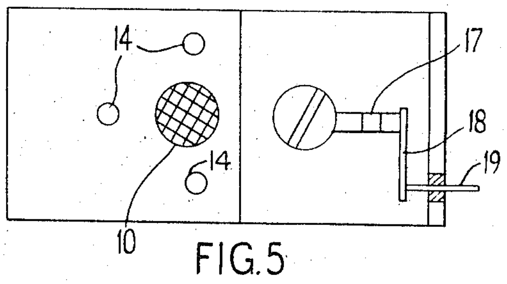
FIGS. 5 and 6 are plan and side views respectively showing details of the module of FIG. 1.
Figure 6:
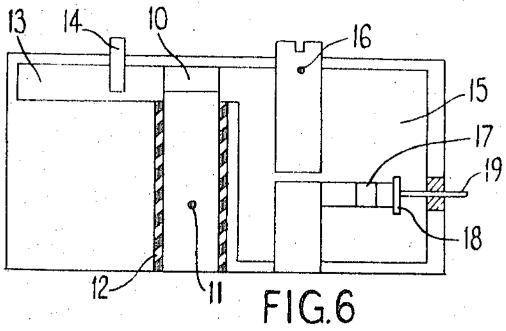

Details of the oscillator module are shown in FIGS. 5 and 6. The Gunn device 10 is heat-sink mounted on a bias post 11, surrounded by an insulating sleeve 12, within a short-circuited waveguide section 13 having a length of 0.825 inch, a height of 0.033 inch, and a width of 0.9 inch. Extending into the device waveguide section 13 are three trimming screws 14, for fine positional adjustment of the circuit locus.

The resonant cavity of the module is formed by a waveguide section 15 having a length of 0.625 inch, a height of 0.4 inch, and width of 0.9 inch. This is the same width as that of the device waveguide section, but the width of the device waveguide section may be less than that of the cavity. There is a tuning screw 16, and an adjustable series capacitor 17 with an output connecting strap 18 to a 50 ohm terminal 19.

The cut-off frequency of waveguide having a width of 0.9 inch is 6.6 GHz. Accordingly, the module comprises a evanescent mode cavity, since the operating frequency range is below the cut-off frequency. Evanescent circuit design is now well established, being described, for example, in "Waveguide below Cut-off: A New Type of Microwave Integrated Circuit," G. F. Craven, The Microwave Journal, August, 1970, page 51, and "The Design of Evanescent Mode Waveguide Bandpass Filters for a Prescribed Insertion Loss Characteristic," G. F. Craven and C. K. Moke, IEEE Trans. MTT, Vol. MTT-19, No. 3, March, 1971.

Figure 7:
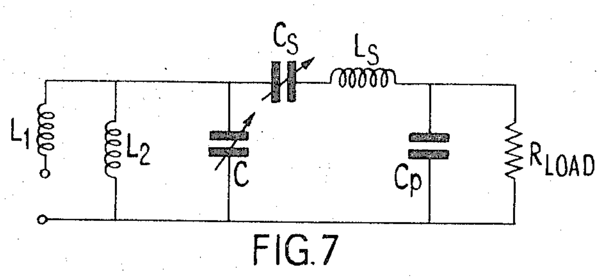
FIG. 7 is the equivalent electrical circuit of the module of FIGS. 5 and 6.

The equivalent circuit of the module is shown in FIG. 7, wherein $L_1$ is the mounting post inductance, $L_2$ is the resultant parallel inductance (waveguide and step), $C_s$ the series capacitance and $L_s$ the inductance associated therewith, C the capacitance of tuning screw 16, and $C_P$ the equivalent (parasitic) capacitance of the output connecting strap.

Figure 8:
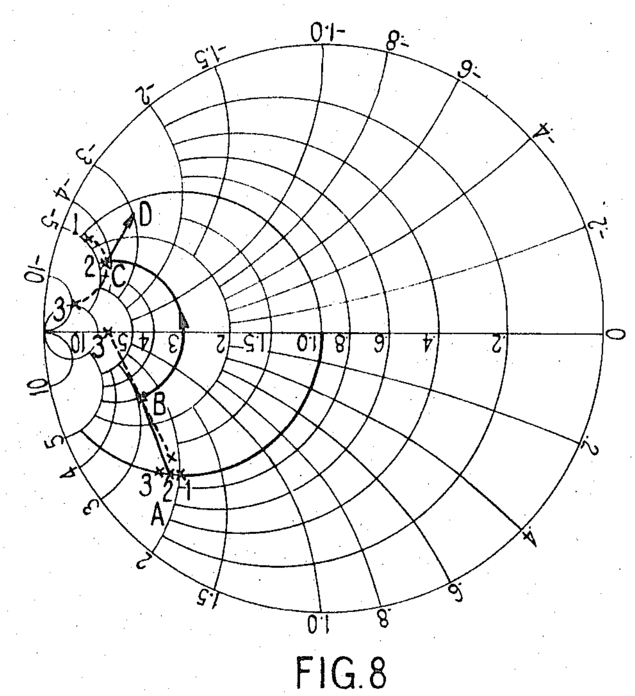
FIGS. 8, 9 and 10 are Smith charts illustrating the operation of the module.
Figure 9:
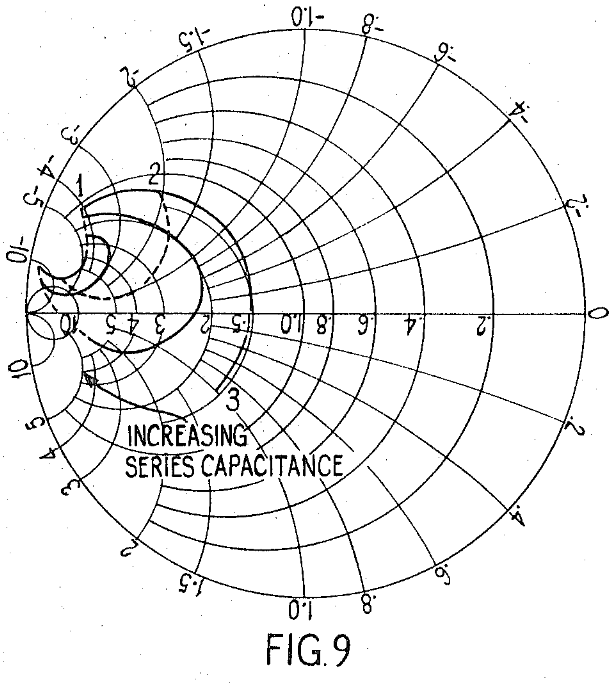

The operation of the module is outlined in FIG. 8. Starting at the 50 ohm load point, which corresponds to the center of the Smith Chart, the initial transformation is via the equivalent capacitance, $C_p$ of the output connecting strap to point A. This is followed by a series transformation, for example, to point B, and then a shunt transformation around to point C. Finally, a second series transformation, due to the post inductance, $L_1$, transforms back to point D. In FIG. 8 the transformation lines are shown for the center of three frequencies, but with the positions of the two outside frequencies marked at each stage. Providing the series and shunt resonant circuits are set to be inductive then it is possible to establish conditions which generate the required counterclockwise effect, with control over the size and position of the locus through the respective settings of $C_s$ and C. The effect of changing C is not shown, but may be readily deduced from the figure by varying the shunt transformation BC. The effect of varying $C_s$, however, is rather more difficult to visualize and, therefore, typical results are shown in FIG. 9.

To set the module, a 50 ohm coaxial probe is inserted in place of the Gunn device and the various tuning elements adjusted until an admittance locus approximating closely to that of the Gunn device is obtained. With this completed, the Gunn device is then inserted, and the circuit fine trimmed for optimum free running performance and subsequently (with the locking signal applied) for maximum bandwidth and/or minimum power variation over the band.

Figure 10:
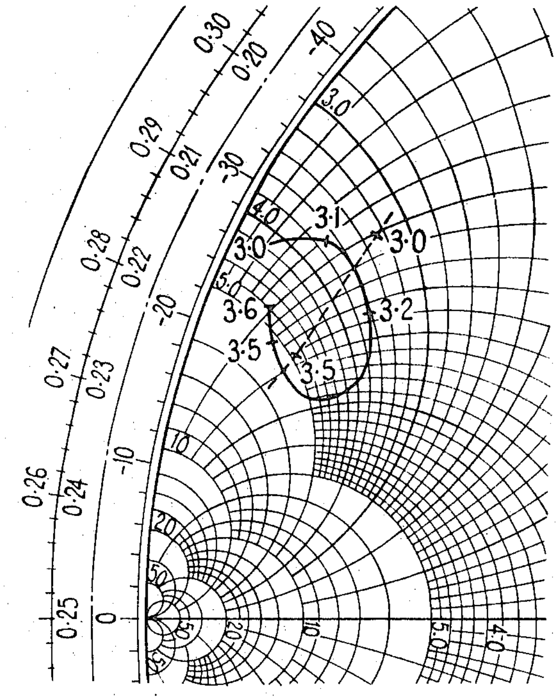
Figure 11:
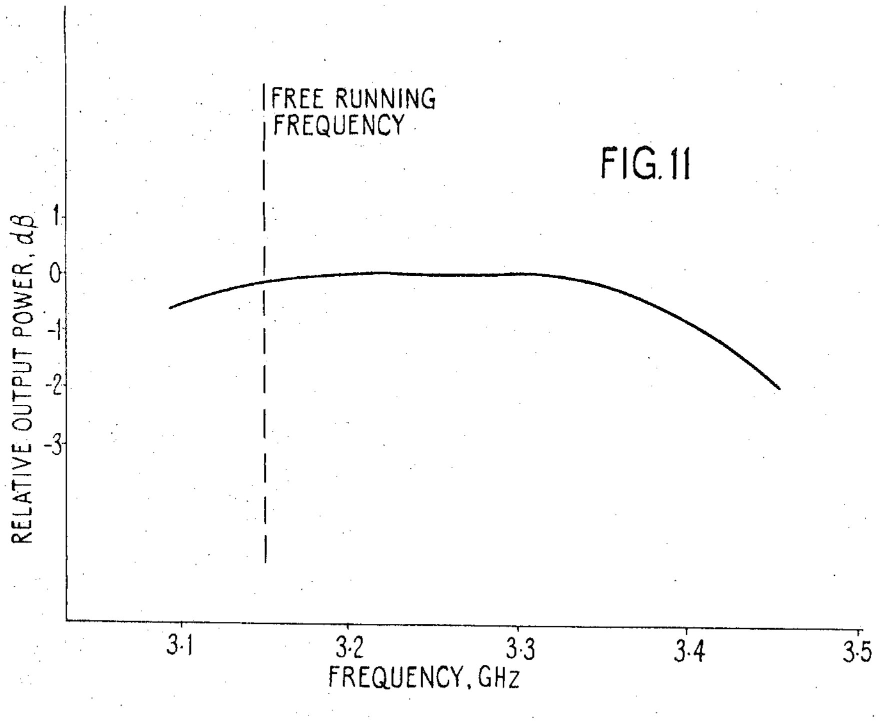
FIG. 11 is illustrative of the power output characteristic of the module over its frequency band.

FIG. 10 shows typical circuit and Gunn device loci (full and dashed line curves respectively) and FIG. 11 shows power variation over a locking frequency band of 3.1 to 3.5 GHz.

As described above, the multituned resonant circuit for achieving the requisite negative impedance approximate match to the Gunn device has been realized as an evanescent mode waveguide resonant cavity. While this form of resonant circuit possesses the basic characteristics required for broadband operation, other forms of resonant circuit may be employed, e.g., shunt or series coaxial circuits, which approach sufficiently closely to the ideal form of the circuit locus for good (low Q) locking control where the circuit and device loci are well matched. It is important that in approximating the ideal circuit locus that small loops in the characteristic are avoided, otherwise localized instabilities in the output will arise which will manifest themselves as noise.

By virtue of an added variable conductance, the locking process is not a lossless one, although the extent of the effect in practice is difficult to determine. The situation is complicated by the degree of match between the circuit and Gunn device loci combined with the susceptibility of the Gunn device to be pulled away from its optimum locus, and it appears that the conductance loss can either be increased or decreased depending on the circuit parameters involved. Losses of 0.5 dB or less are achievable over a significant portion of the band. Towards the band edges some increase is likely due to the divergence of two loci, possibly as large as 1–2 dB. This is a fundamental effect, but by correct circuit design it is possible to restrict it to the extreme edges of the band, thus, maximizing the low loss region.

While we have described above the principles of our invention in connection with the specific apparatus it is to be clearly understood that this description is made only by way of example and not as a limitation to the scope of our invention as set forth in the objects thereof and in the accompanying claims.

We claim:

1. A microwave oscillator arrangement with wideband frequency control comprising:

a multituned microwave resonant circuit;

a two terminal solid state microwave oscillator device disposed in said resonant circuit; and a frequency controlling injection locking oscillator coupled to said resonant circuit, said locking oscillator having an injection locking output signal which modifies the impedance of said resonant circuit so that over a required frequency band said oscillator device is presented with the negative of its impedance;

said resonant circuit having a given resonant frequency and a counter-clockwise Smith chart admittance locus with increasing frequency approximating the Smith chart admittance locus of said oscillator device; and said injection locking output signal modifies the admittance of said resonant circuit to add capacitance to said resonant circuit below said resonant frequency of said resonant circuit and to add inductance to said resonant circuit above said resonant frequency of said resonant circuit to enable achievement of said wideband frequency control.

2. An arrangement according to claim 1, wherein said oscillator device is a Gunn diode.

3. An arrangement according to claim 1, wherein said resonant circuit includes an evanescent mode waveguide resonant cavity.

4. An arrangement according to claim 3, wherein said oscillator device is a Gunn diode.

* * * * *